(12) United States Patent
Fu

(10) Patent No.: US 12,099,290 B2
(45) Date of Patent: Sep. 24, 2024

(54) BLADE DRIVING DEVICE, CAMERA DEVICE AND ELECTRONIC APPARATUS

(71) Applicant: New Shicoh Motor Co., Ltd., Zhejiang (CN)

(72) Inventor: Xuepeng Fu, Yamato (JP)

(73) Assignee: NEW SHICOH MOTOR CO., LTD, Zhejiang (CN)

( * ) Notice: Subject to any disclaimer, the term of this patent is extended or adjusted under 35 U.S.C. 154(b) by 57 days.

(21) Appl. No.: 17/846,478

(22) Filed: Jun. 22, 2022

(65) Prior Publication Data

US 2022/0413359 A1     Dec. 29, 2022

(30) Foreign Application Priority Data

Jun. 23, 2021   (CN) ......................... 202110699806.4
Jun. 23, 2021   (CN) ......................... 202110701517.3

(51) Int. Cl.
  *G03B 9/06*   (2021.01)
  *H05K 1/18*   (2006.01)

(52) U.S. Cl.
  CPC ............... *G03B 9/06* (2013.01); *H05K 1/189* (2013.01); *H05K 2201/10151* (2013.01); *H05K 2201/10265* (2013.01)

(58) Field of Classification Search
  None
  See application file for complete search history.

(56) References Cited

U.S. PATENT DOCUMENTS

| 8,508,828 B2* | 8/2013 | Durfee ................ G03B 9/22 359/230 |
| 2012/0076486 A1* | 3/2012 | Bai .................... G03B 9/06 396/463 |
| 2015/0247503 A1* | 9/2015 | Seiss .................. F04D 7/04 417/420 |
| 2020/0064711 A1* | 2/2020 | Kim .................... G03B 9/06 |
| 2020/0235649 A1* | 7/2020 | Hayward ............. H02K 33/04 |
| 2022/0413361 A1* | 12/2022 | Fu ..................... G01B 7/003 |

FOREIGN PATENT DOCUMENTS

CN           110858048 A        3/2020
KR     10-2018-0105970 A       10/2018

* cited by examiner

*Primary Examiner* — Rodney E Fuller
(74) *Attorney, Agent, or Firm* — Hayes Soloway PC

(57) ABSTRACT

A blade driving device in which a central axis is defined includes a plurality of blades, two coil groups and a magnet. The blades are arranged around the central axis. The two coil groups are arranged around the central axis, include at least two coils with the central axis direction as a winding axis and are separated in the central axis direction. The magnet is arranged between the two coil groups in such a manner that a magnetized surface faces the two coil groups. The coils and the magnet generate an electromagnetic force along a circumferential direction of a circle centered on the central axis to drive the blades.

19 Claims, 15 Drawing Sheets

BLADE DRIVING DEVICE, CAMERA DEVICE AND ELECTRONIC APPARATUS

CROSS-REFERENCE TO RELATED APPLICATIONS

This application claims the benefit of Chinese Patent Application No. 202110701517.3 filed on Jun. 23, 2021, which is hereby incorporated by reference herein in its entirety.

TECHNICAL FIELD

The present disclosure relates to a blade driving device used in electronic apparatus such as smartphones, a camera device and an electronic apparatus.

BACKGROUND

Various techniques have been proposed to adjust the amount of light in the lens body by sliding the blades of the camera device. The camera module disclosed in Chinese Patent Publication No. 110858048A (hereinafter referred to as "Patent Document 1") has three blades arranged around the incident hole, and these three blades are driven to change the amount of light incident on the lens body. In this camera module, three driving coils are arranged on the FPC (Flexible Printed Circuits) on the bottom surface of the housing that holds the blades and three driving magnets are arranged on the movable ring facing the housing, respectively, and the movable ring is rotated about the optical axis by the electromagnetic force generated by the driving coils and the driving magnets to move the blades. The diaphragm mechanism device disclosed in Korean Patent Publication No. 2018-0105970A (hereinafter referred to as "Patent Document 2") has two substantially L-shaped blades called blades facing each other around the incident hole, and these two blades are driven to change the amount of light incident on the lens body. In this diaphragm mechanism device, three coils are arranged on the FPC on the bottom surface of the base and three permanent magnets are arranged on the rotation ring on the upper side of the base, respectively, and the rotation ring is rotated about the optical axis by the electromagnetic force generated by the coils and the permanent magnets to move the blades.

However, in the techniques described in Patent Documents 1 and 2, there was a problem that a plurality of groups each consisting of one coil and a magnet whose surface facing this coil is magnetized to two different magnetic poles are arranged around the incident hole, and the spatial efficiency of the electromagnetic force generation is low. Further, there was a problem that it is difficult to supply power to a coil when the coil is located at a position away from the substrate on the bottom surface.

SUMMARY

The present disclosure has been made in view of such problems, and a first object thereof is to provide a blade driving device with a high spatial efficiency of electromagnetic force generation, and a second object thereof is to provide a blade driving device capable of supplying power to a coil even located at a position away from the bottom surface.

In accordance with a first aspect of the present disclosure, there is provided a blade driving device in which a central axis is defined, including: a plurality of blades arranged around the central axis; two coil groups arranged around the central axis, having at least two coils with the central axis direction as a winding axis, and separated in the central axis direction; a magnet arranged between the two coil groups in such a manner that a magnetized surface faces the two coil groups, wherein the coils and the magnet generate an electromagnetic force along a circumferential direction of a circle centered on the central axis to drive the blades. In accordance with a second aspect of the present disclosure, there is provided a camera device including the blade driving device described above.

In accordance with a third aspect of the present disclosure, there is provided an electronic apparatus including the camera device described above.

Further features of the present invention will become apparent from the following description of exemplary embodiments with reference to the attached drawings.

DETAILED DESCRIPTION OF THE DRAWINGS

Figure 1:
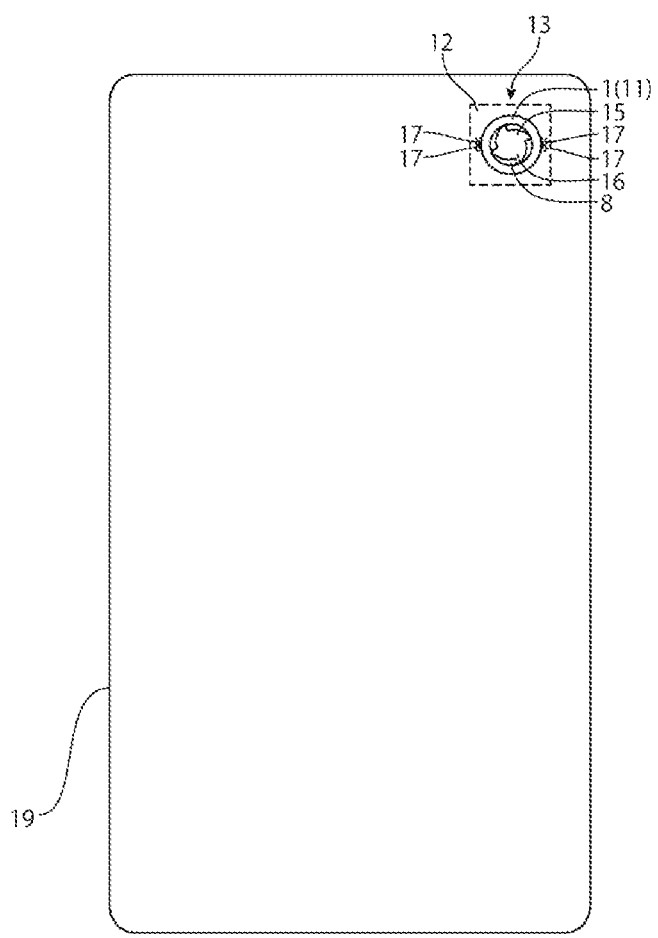
FIG. 1 is a front view of a smartphone on which a camera device is mounted, the camera device including a blade driving device according to a first embodiment of the present disclosure.
Figure 2:
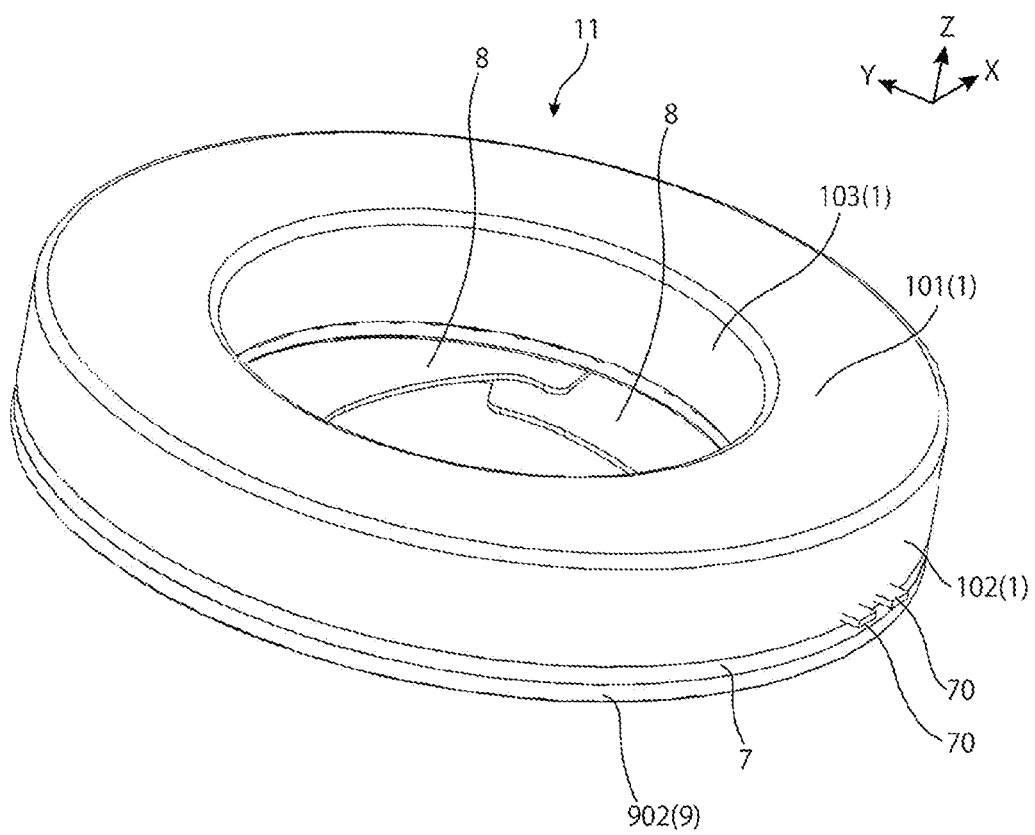
FIG. 2 is a perspective view of the blade driving device of FIG. 1.

Hereinafter, the first embodiment of the present disclosure is explained with reference to drawings. As shown in FIG. 1, a camera device 13 including a blade driving device 11 according to the first embodiment of the present disclosure is accommodated in a smartphone 19.

The camera device 13 includes: a lens body 15; an image sensor 16 that converts light from the lens body 15 into an electrical signal; a lens driving device 12 that drives the lens body 15; and a blade driving device 11 that drives the blades 8 arranged on the front side of the lens body 15.

Hereinafter, the direction in which the light from the subject is incident is appropriately referred to as a Z direction, one direction orthogonal to the Z direction is appropriately referred to as an X direction, and a direction orthogonal to both the Z direction and the X direction is appropriately referred to as a Y direction. Further, the +Z side of the optical axis of the lens body 15, which is the side of the subject, may be referred to as a front side, and the −Z side, which is the side on which the image sensor 16 on the opposite side of the subject is provided, may be referred to as a rear side.

The lens driving device 12 has a lens carrier that movably holds the lens body 15 in the optical axis direction. The blade driving device 11 is configured such that the optical axis of the lens body 15 becomes the central axis of the blade driving device 11. The central axis is an axis passing through the center of the blade driving device 11 in the Z direction, and the central axis direction and the Z direction are the same. The central axis direction may also be a front-rear direction. In the lens driving device 12, metallic receiving portions 17 are provided at ends on the −Y side and +Y side of the front surface of the lens carrier. The receiving portions 17 extend toward the +Z side. The lens driving device 12 supports metal members 70 protruding to the −Y side and the +Y side of the blade driving device 11 by the receiving portions 17, and supplies electric power to the blade driving device 11 via the receiving portions 17 and the metal members 70.

Figure 3:
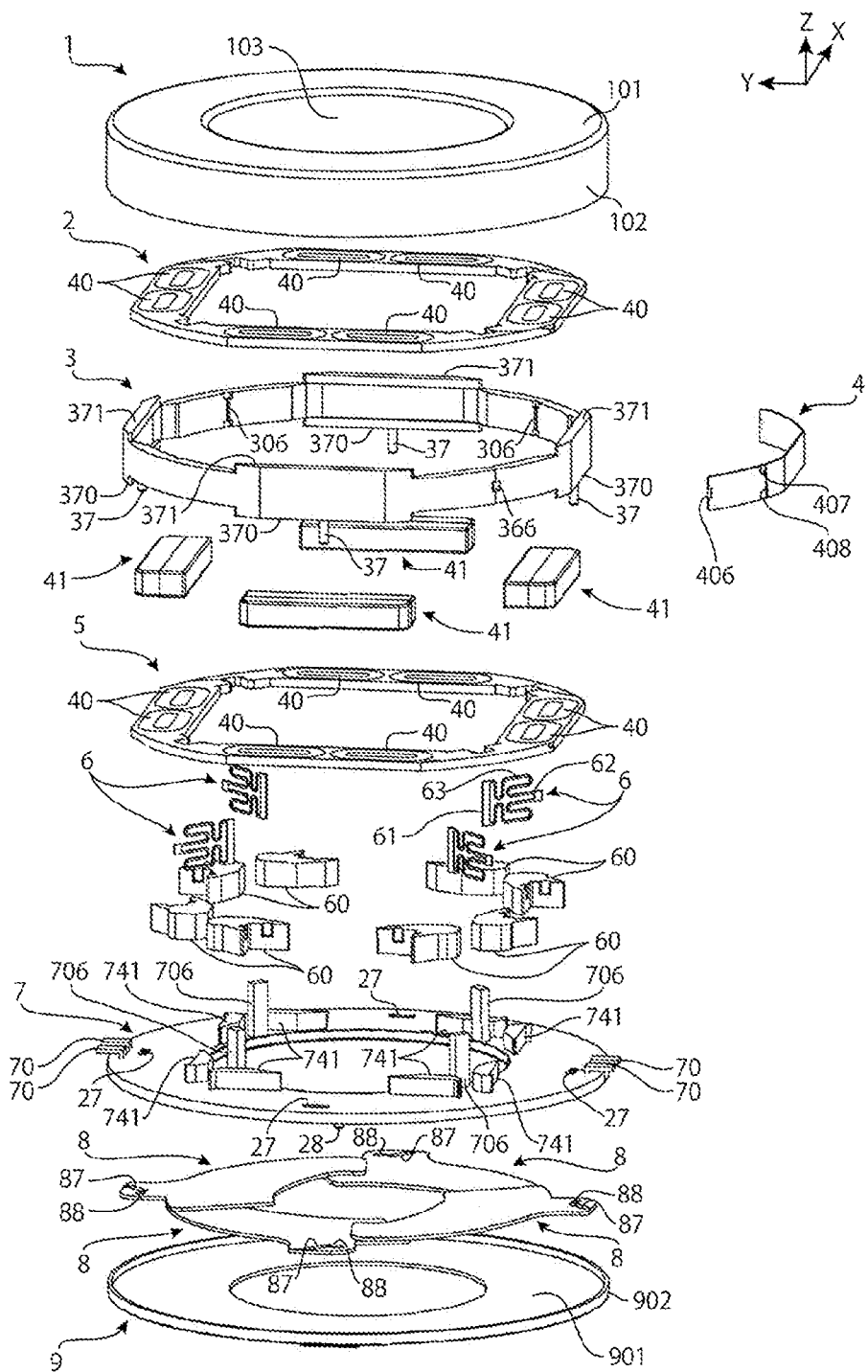
FIG. 3 is an exploded perspective view of the blade driving device of FIG. 2.
Figure 4:
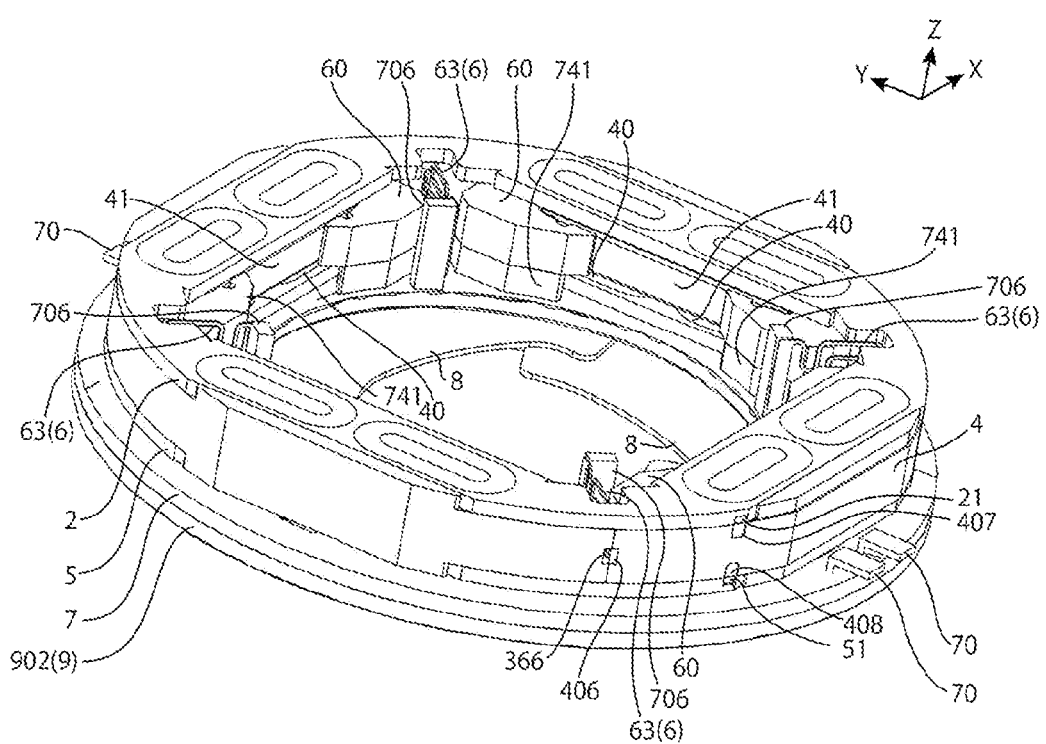
FIG. 4 is a diagram in which the front cover is removed from FIG. 2.
Figure 5:
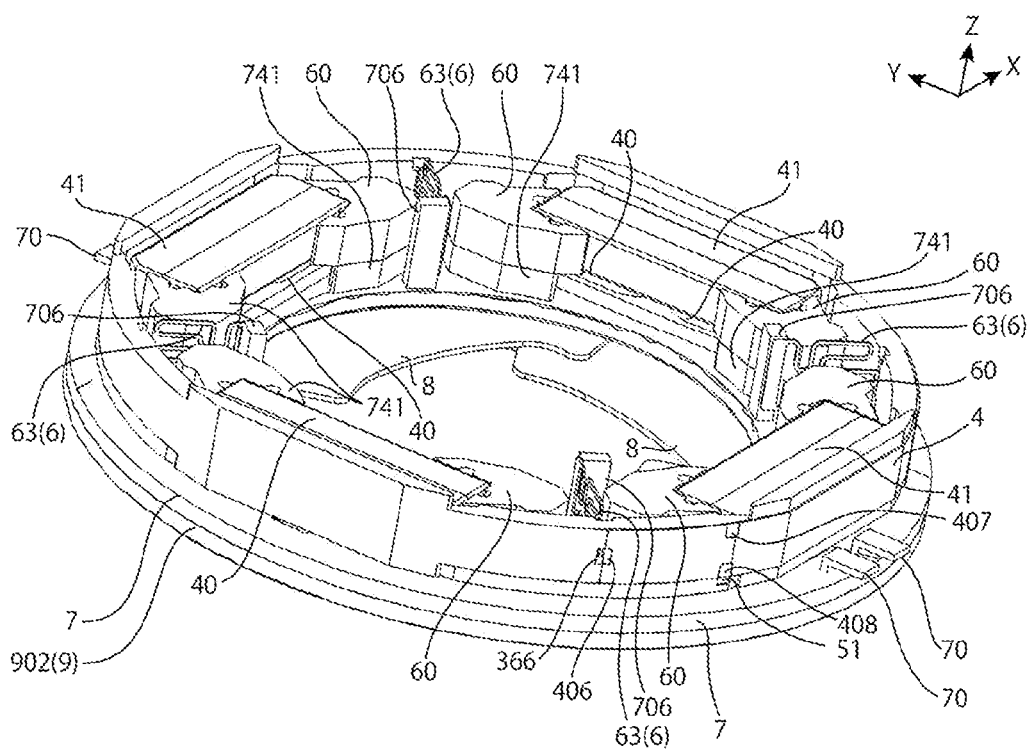
FIG. 5 is a diagram in which the front side coil substrate is removed from FIG. 4.

As shown in FIG. 3, the blade driving device 11 includes a front cover 1, a front side coil substrate 2, a movable ring 3, an FPC 4, four magnets 41, a rear side coil substrate 5, four plate springs 6, eight support members 60, a base 7, four blades 8, and a rear cover 9. Among these, the front cover 1, the magnets 41, the support members 60, and the base 7 constitute a fixed portion which is not accompanied by movement with respect to the lens driving device 12. Coil groups are configured on the front side coil substrate 2 and the rear side coil substrate 5, respectively. The coil group has a plurality of coils 40 arranged on one plane, and may be such that the plurality of coils 40 are arranged on a predetermined plate.

The front cover 1 includes a front side wall portion 101, an outer peripheral wall portion 102, and an inner peripheral wall portion 103. The inner peripheral wall portion 103 and the outer peripheral wall portion 102 extend to the −Z side from the inner peripheral edge and the outer peripheral edge of the front side wall portion 101, and the front cover 1 has an annular shape when viewed from the central axis direction.

The front side coil substrate 2 is formed in an annular shape having a quadrangular inside and a rounded-corner quadrangular outside. Every two coils 40 are embedded on the +X side, the −X side, the +Y side and the −Y side of the through hole in the center of the front side coil substrate 2, respectively. The coils 40 arranged on the +X side and the −X side are aligned in the Y direction, and each coil 40 has two linear portions extending in the Y direction. The coils 40 arranged on the +Y side and the −Y side are aligned in the X direction, and each coil 40 has two linear portions extending in the X direction.

The movable ring 3 is formed in an approximately annular shape with a width in the front and rear. On the +X side, the −X side, the +Y side, and the −Y side of the movable ring 3, there are table portions 371 and 370 protruding forward and rearward, respectively. Each table portion 370 is provided with a movable pin 37 protruding further rearward. Slits 306 are provided on the +X+Y side, the +X−Y side, the −X+Y side, and the −X−Y side of the inner surface of the movable ring 3. Holes 366 are provided on the +X−Y side and the −X−Y side of the outer surface of the movable ring 3. The holes 366 are connected to slits 306 on the +X−Y side and the −X−Y side.

The FPC 4 has a width in the front and rear approximately the same as the movable ring 3 and extends in the circumferential direction, and is disposed outside the movable ring 3 along a portion from the hole 366 on the +X−Y side to the hole 366 on the −X−Y side. Lands 406 are provided at both ends of the FPC 4, respectively. Two lands 407 and 408 are provided at the front end side and the rear end side of the FPC 4, respectively.

The magnets 41 are attached to the base 7 and are provided on the +X side, the −X side, the +Y side and the −Y side. The magnets 41 arranged on the +X side and the −X side are plate-like bodies extending in the Y direction, and are magnetized in the front-rear direction, and are magnetized so that the inner periphery side half and the outer periphery side half become opposite magnetic poles. The magnets 41 arranged on the +Y side and the −Y side are plate-like bodies extending in the X direction, and are magnetized in the front-rear direction, and are magnetized so that the inner periphery side half and the outer periphery side half become opposite magnetic poles.

The rear side coil substrate 5 is formed in an annular shape having a quadrangular inside and a rounded-corner quadrangular outside. Every two coils 40 are embedded on the +X side, the −X side, the +Y side and the −Y side of the through hole in the center of the rear side coil substrate 5, respectively. The coils 40 arranged on the +X side and the −X side are aligned in the Y direction, and each coil 40 has two linear portions extending in the Y direction. The coils 40 arranged on the +Y side and the −Y side are aligned in the X direction, and each coil 40 has two linear portions extending in the X direction.

The plate spring 6 has an inner edge portion 61, an outer edge portion 62, an arm portion 63 elastically connecting the inner edge portion 61 and the outer edge portion 62. The arm portion 63 is constituted of a thread-like winding elastic member.

The support member 60 is a plate-like body having an L-shaped portion in which a corner of the magnet 41 is accommodated when viewed from the central axis direction. The support members 60 are fixed to the base 7, and are support members for supporting the magnets 41 by sandwiching the magnets 41 from both sides in the extending direction in pairs. On the outside of the L-shaped portion of the support member 60, the inner periphery side corner and the outer periphery side corner of the surface facing the spring member 6 after being incorporated are chamfered.

The base 7 is formed in an annular shape. Four metal members 70 are embedded in the base 7 so as to surround the through hole in the center of the base 7. One end portions of two metal members 70 on the +Y side rise in a stepped shape at the outer edge on the +Y side of the base 7 and then project outward, and one end portions of two metal members 70 on the −Y side rise in a stepped shape at the outer edge on the −Y side of the base 7 and then project outward. The other end portions of the metal members 70 rise from the peripheral edge portion surrounding the through hole of the base 7 together with the column portions 706.

Two table portions 741 are provided at intervals on the +X side, the −X side, the +Y side, and the −Y side of the inner peripheral edge portion surrounding the through hole of the base 7, respectively. The height of the table portion 741 in the front-rear direction is higher than the height of the rear side coil substrate 5 in the front-rear direction. Column portions 706 rise from the peripheral edge portion surrounding the through hole between the adjacent table portions 741. Long holes 27 and fixing pins 28 are provided at positions near to each other at the outer peripheral edge on the +X side, the −X side, the +Y side, and the −Y side of the base 7, respectively. The long holes 27 and the fixing pins 28 are provided close to each other in the tangential direction of the circle, and the long holes 27 extend in the tangential direction of this circumference. The fixing pins 28 extend rearward from the rear surface of the base 7.

The blade 8 is a flat plate, and four blades 8 of the same shape are arranged at 90° intervals to form an aperture in the center. The protruding portion protruding from the outer edge of the blade 8 is provided with a movable hole 87 and a fixing hole 88. The movable hole 87 extends in an intermediate direction between the radial direction and the tangential direction of the circumference, and the fixing hole 88 has a circular shape.

The rear cover 9 has an annular bottom surface portion 901, and an edge portion 902 protruding to the +Z side from the outer peripheral edge.

The blade driving device 11 is manufactured as follows.

First, the FPC 4 is stuck to the outer peripheral surface of the movable ring 3. Then, the rear side coil substrate 5 is placed and fixed between the two table portions 370 from the rear side of the movable ring 3, and the two lands 408 and the rear side coil substrate 5 are electrically connected. The assembly of the movable ring 3 is placed on the front surface of the solid plate 7 in which the metal members 70 are embedded in advance. At this time, the movable pins 37 are fitted into the long holes 27.

Next, the support members 60 are fixed on the front side surfaces of the table portions 741 of the base 7, and the magnets 41 are arranged so as to be accommodated between the L-shaped portions of two support members 60 and fixed to the support members 60. Next, the outer edge portion 62 of the plate spring 6 is inserted into and fixed to the slit 306 of the movable ring 3. Since the corner on the outer periphery sider of the support member 60 is chamfered, it is possible to perform work such as supplying an adhesive. The outer edge portion 62 of the plate spring 6 inserted into the slit 306 with a hole 366 is electrically connected to the land 406 of the FPC 4 from the outside of the hole 366.

Next, the front side coil substrate 2 is placed and fixed between the two table portions 371 from the front side of the movable ring 3, and the two lands 407 and the front side coil substrate 2 are electrically connected. Next, the assembly of the movable ring 3 is slightly lifted and fixed to the inner edge portion 61 of the spring member 6 and the column portion 706 of the base 7. At this time, the spring member 6 electrically connected to the FPC 4 is electrically connected to the metal member 70. Since the corner on the inner periphery side of the support member 60 is chamfered, it is possible to perform work such as supplying an adhesive or electrically connecting. Thus, the movable ring 3 mounting the front side coil substrate 2 and the rear side coil substrate 5 in which the coils 40 are embedded are supported by the column portions 706 of the base 7 via the plate springs 6. Further, the magnets 41 and the coils 40 of the front side coil substrate 2 face each other, and the magnets 41 and the coils 40 of the rear side coil substrate 5 face each other in the front-rear direction.

Next, the blades 8 are attached to the base 7. The fixing pin 28 of the base 7 is attached so as to be fitted into the fixing hole 88 of the blade 8, and the movable pin 37 of the movable ring 3 extending further rearward from the long hole 27 is attached so as to be fitted into the movable hole 87 of the blade 8. Finally, the front cover 1 and the rear cover 9 are fixed to the base 7. That is, the inner peripheral wall portion 103 and the outer peripheral wall portion 102 of the front cover 1 are fixed to the inner peripheral edge and the outer peripheral edge of the through hole of the base 7. Further, the edge portion 902 of the rear cover 9 is fixed to the outer peripheral edge of the base 7.

After completion of the blade driving device 11, the rear surfaces of the exposed portions on the +Y side and the −Y side of the four metal members 70 of the blade driving device 11 are welded or soldered to the front surfaces of the receiving portions 17 of the lens driving device 12.

Here, the two linear portions of the coil 40 and the respective magnetic pole surfaces of the magnet 41 face each other. For example, in the magnetic pole surface on the +Z side of the magnet 41 on the +X side, the magnetic pole surface on the +X side is magnetized to the N-pole, and the magnetic pole surface on the −X side is magnetized to the S-pole. It is assumed that an electric current flows in the clockwise direction in the −Y side coil 40 on the +X side of the front side coil substrate 2. An electromagnetic force is generated in in the −X direction the two linear portions of this coil 40 and becomes a thrust force in the clockwise direction. It is assumed that an electric current flows in the counterclockwise direction in the +Y side coil 40 on the +X side of the front side coil substrate 2. An electromagnetic force is generated in the +X direction in the two linear portions of this coil 40 and becomes a thrust force in the clockwise direction. By making an electric current in the same direction flow in the coil 40 at the same position of the rear side coil substrate 5, an electromagnetic force in the same direction is generated and becomes a thrust force in the same direction.

As described above, when an electric current is supplied to the coils 40, a thrust force in a direction around the central axis is produced by the electromagnetic force generated by the coils 40 and the magnets 41. The movable ring 3 rotates with respect to the base 7 by this thrust force. With this rotation, the movable pin 37 of the movable ring 3 moves in the long hole 27 of the base 7 and the movable hole 87 of the blade 8, and the blade 8 rotates around the axis of the fixing pin 28 fitted in the fixing hole 88. By the rotation of the four blades 8, the size of the aperture surrounded by the inner periphery of the four blades 8 is changed, and the amount of light from the subject to the image sensor 16 via the lens body 15 is controlled. Then, when the electric current supplied to the coils 40 is stopped, the movable ring 3 returns to the original position, the four blades 8 return to the original positions, and the aperture returns to the original state by the elastic force of the plate springs 6.

The details of the present first embodiment are explained above. The blade driving device 11 according to the present first embodiment, in which a central axis is defined, includes: a plurality of blades 8 arranged around the central axis; two coil groups arranged around the central axis, having at least two coils 40 with the central axis direction as the winding axis, and separated in the central axis direction; and a magnet 41 arranged between the two coil groups so that the magnetized surface faces the two coil groups, wherein the coils 40 and the magnet 41 generate an electromagnetic force along the circumferential direction of a circle centered on the central axis to drive the blades. An electromagnetic force is generated by the two coil groups arranged on both sides of the magnet 41. Thus, it is possible to provide a blade driving device 11 with a high spatial efficiency of electromagnetic force generation.

It is to be noted that in the above first embodiment, one magnet 41, two coils 40 included in the front side coil substrate 2 and facing this magnet 41, and two coils 40 included in the rear side coil substrate 5 and facing this magnet 41 are explained as one group. However, for example, one magnet 41, one coil 40 included in the front side coil substrate 2 and facing this magnet 41, and one coil 40 included in the rear side coil substrate 5 and facing this magnet 41 may also be one group. The number of the coils 40 and the number of the magnetic poles of the plate surface of the magnet 41 facing the coil 40 may be different for each group. In addition, the number of the groups of the magnets 41 and the coils 40 may be two groups, three groups, or five groups or more.

In addition, in the above the first embodiment, the magnet 41 may be fixed to the movable ring 3, and the front side coil substrate 2 and the rear side coil substrate 5 may be fixed to the fixed portion. In addition, for example, a magnet 41 is further provided on the front side of the front side coil substrate 2, and a coil substrate having a coil 40 may be provided on its front side. Each coil 40 may be provided with linear portions extending in the radial direction. The magnet 41 may be composed of two magnet pieces whose individual magnetization directions are reversed.

Figure 6:
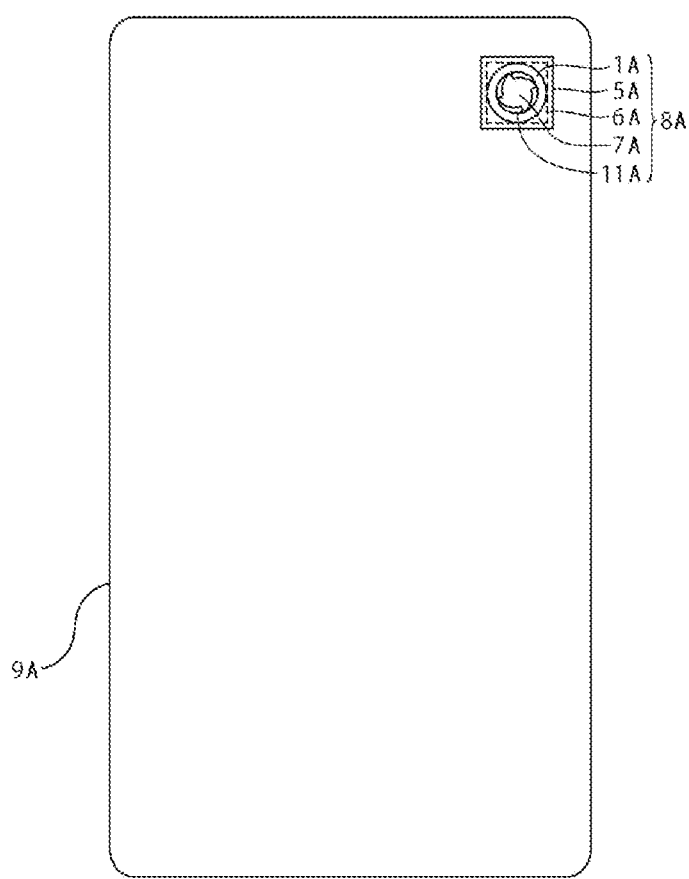
FIG. 6 is a front view of a smartphone on which a camera device is mounted, the camera device including a blade driving device and a lens driving device according to the second embodiment of the present disclosure.

Hereinafter, the second embodiment of the present disclosure is explained with reference to drawings. As shown in FIG. 6, a camera device 8A including a blade driving device 1A according to the second embodiment of the present disclosure is accommodated in a smartphone 9A.

The camera device 8A includes: a lens body 7A; an image sensor 6A that converts light from the lens body 7A into an electrical signal; a lens driving device 5A that drives the lens body 7A; and a blade driving device 1A that drives the blades 11A arranged on the front side of the lens body 7A.

Hereinafter, the direction in which the light from the subject is incident is appropriately referred to as a Z direction, one direction orthogonal to the Z direction is appropriately referred to as an X direction, and a direction orthogonal to both the Z direction and the X direction is appropriately referred to as a Y direction. Further, the +Z side of the optical axis of the lens body 7A, which is the side of the subject, may be referred to as a front side, and the −Z side, which is the side on which the image sensor 6A on the opposite side of the subject is provided, may be referred to as a rear side. Further, the +X side may be referred to as an upper side, the −X side may be referred to a lower side, the +Y side may be referred to a left side, and the −Y side may be referred to a right side.

Figure 7:
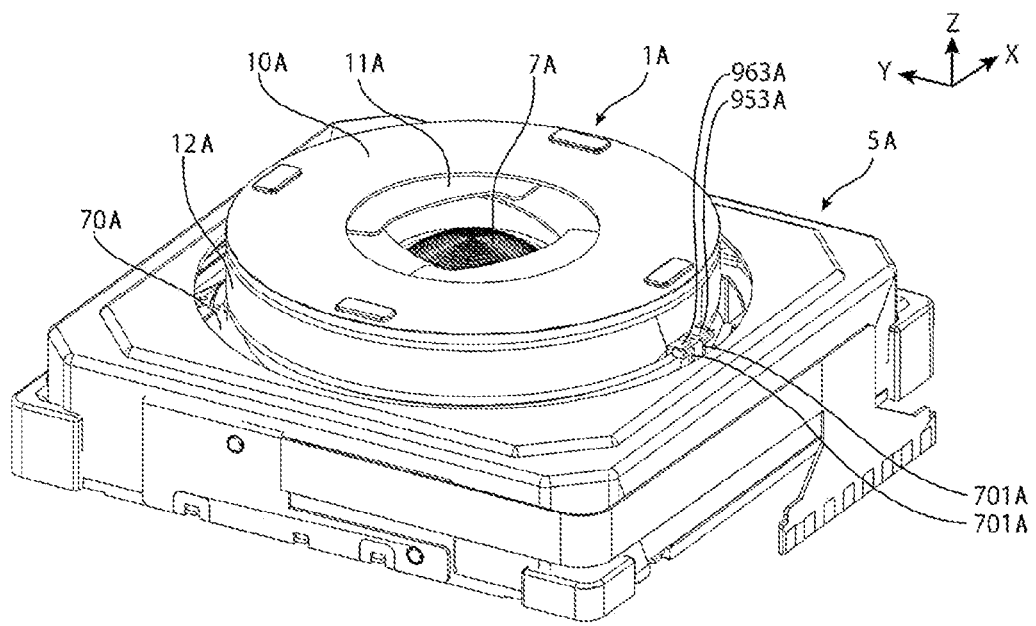
FIG. 7 is a perspective view of the blade driving device and the lens driving device of FIG. 6.
Figure 8:
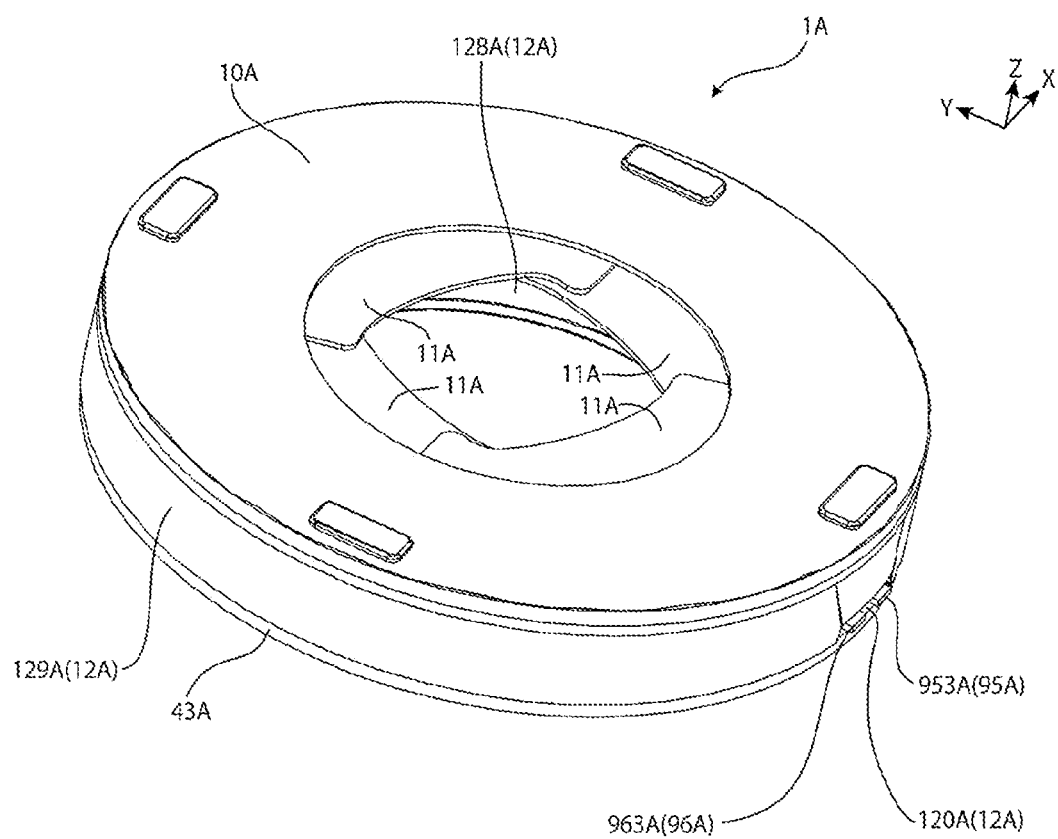
FIG. 8 is a perspective view of the blade driving device of FIG. 7.

As shown in FIG. 7, the lens driving device 5A has a lens carrier 70A inside thereof, and the lens carrier 70A holds the lens body 7A. On the +Y side and the −Y side of the front surface of the lens carrier 70A, metallic carrier side receiving portions 701A for supporting the blade driving device 1A and supplying power to the blade driving device 1A are provided. Blade side receiving portions 953A, 963A are provided correspondingly to the blade driving device 1A. The blade driving device 1A is configured such that the optical axis of the lens body 7A becomes the center of the blade driving device 1A. Since the blade driving device 1A is supported by the carrier side receiving portions 701A and the blade side receiving portions 953A, 963A, the blade driving device 1A does not come into contact with the lens body 7A. The lens carrier 70A is supported movably at least in the optical axis direction of lens body 7A, and the blade driving device 1A moves together with the lens carrier 70A and the lens body 7A.

Figure 9:
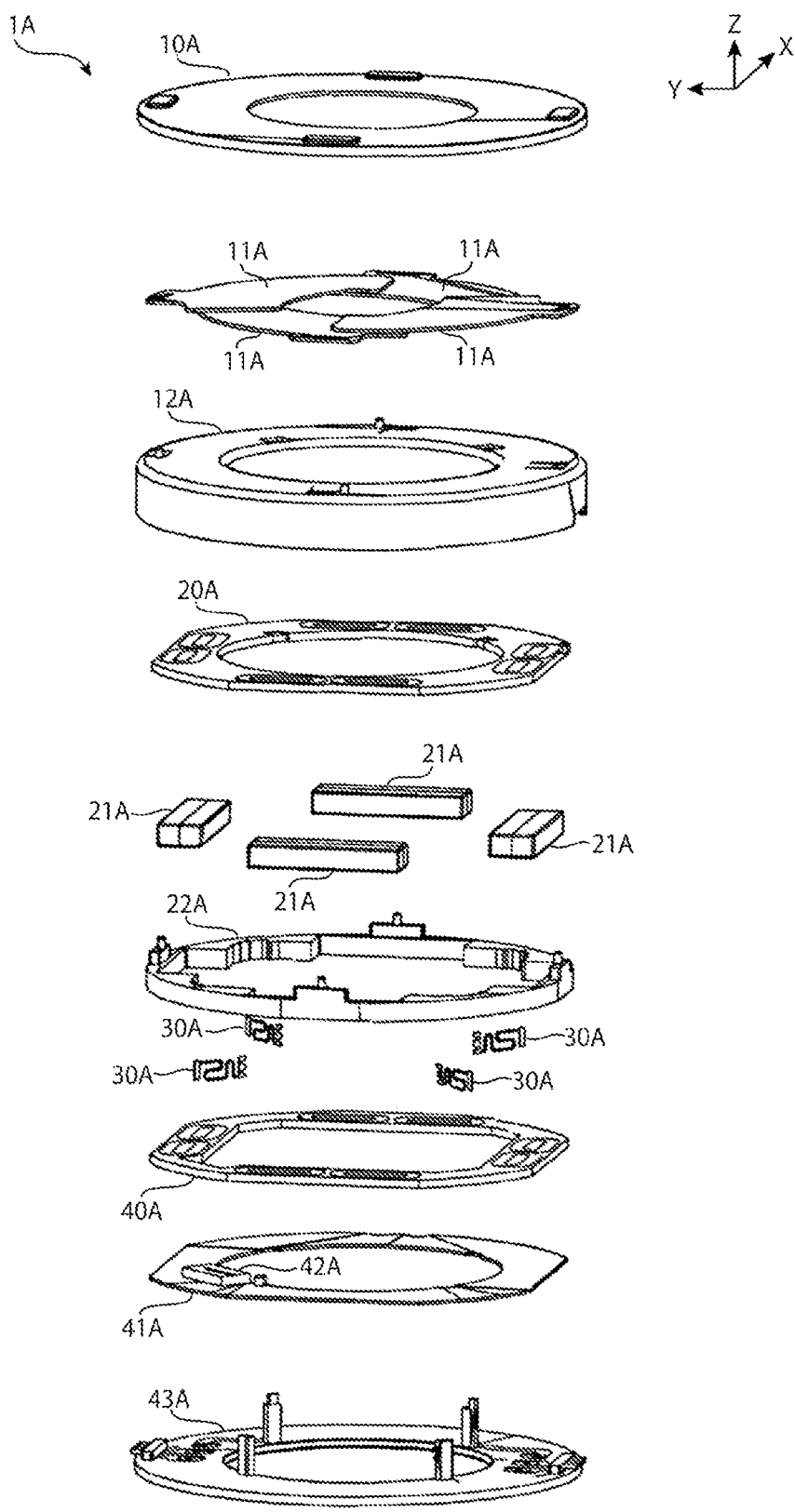
FIG. 9 is an exploded perspective view of the blade driving device of FIG. 8.

As shown in FIG. 9, the blade driving device 1A has a cover 10A, four blades 11A, a fixed plate 12A, a front side coil substrate 20A, four magnets 21A, a movable ring 22A, four plate springs 30A, a rear side coil substrate 40A, a circuit board 41A, a Hall IC 42A, and a base 43A. Among these, the cover 10A, the fixed plate 12A, the front side coil substrate 20A, the rear side coil substrate 40A, the circuit board 41A, the Hall IC 42A, and the base 43A constitute a fixed portion which is not accompanied by movement with respect to the lens carrier 70A.

The cover 10A is formed in an annular shape. The blade 11A is a flat plate, and four blades 11A are circularly arranged. The protruding portion protruding in an approximately rectangular shape at the outer edge of the blade 11A is provided with a fixing hole 113A and a movable hole 114A. The fixing hole 113A is formed in a perfect circular shape. The movable hole 114A has a shape in which the perfect circle is extended in its diameter direction. An aperture is formed on the inner periphery side of the four blades 11A. By rotating the blades 11A around the fixing holes 113A, the size of this aperture is controlled, and the amount of light from the subject to the image sensor 6A via the lens body 7A is controlled.

The fixed plate 12A has a disk portion 127A, an inner peripheral wall portion 128A, and an outer peripheral wall portion 129A. Fixed pins 123A and long holes 124A are provided at positions near to each other at the outer peripheral edge on the +X side, the −X side, the +Y side, and the −Y side of the disk portion 127A, respectively. The fixing pin 123A and the long hole 124A are provided close to each other in the tangential direction of a circle, and the long hole 124A extends in the tangential direction of the circumference. In addition, holes 125A are provided at the inner peripheral edge of the disk portion 127A on the +X+Y side and the +X−Y side, respectively. The inner peripheral wall portion 128A and the outer peripheral wall portion 129A extend to the −Z side from the inner peripheral edge and the outer peripheral edge of the disk portion 127A. Notches 120A are provided on the +Y side and the −Y side of the rear end of the outer peripheral wall portion 129A.

The front side coil substrate 20A is formed in an annular shape. Every two coils 121A are embedded on the +X side, the −X side, the +Y side and the −Y side of the through hole in the center of the front side coil substrate 20A, respectively. The two coils 121A arranged on the +X side and the −X side are aligned in the Y direction and each of them has linear portions extending in the Y direction. The two coils 121A arranged on the +Y side and the −Y side are aligned in the X direction and each of them has linear portions extending in the X direction. Eight coils 121A are arranged at the same height. Lands 201A are provided at positions on the +X+Y side and the +X−Y side of the inner peripheral edge of the front side coil substrate 20A. Two lands 201A are electrically connected to each other via respective coils 121A arranged in the front side coil substrate 20A.

The movable ring 22A is formed in an annular shape. On the +X side, the −X side, the +Y side, and the −Y side of the inner peripheral wall of the movable ring 22A, there are recess portions 220A recessed to the outer periphery side. Magnets 21A are accommodated in and fixed to the recess portions 220A on the +X side, the −X side, the +Y side, and the −Y side, respectively. The magnets 21A are magnetized in the front-rear direction so that the inner periphery side half and the outer periphery side become opposite magnetic poles.

There are table portions 222A protruding forward at the outer peripheral edge on the +X side, the −X side, the +Y side, and the −Y side of the front surface of the movable ring 22A, respectively, and each table portion 222A is provided with a movable pin 224A protruding further forward. Slits 223A are provided on the +X+Y side, the +X−Y side, the −X+Y side, and the −X−Y side of the inner peripheral wall of the movable ring 22A, that is, between the recess portion 220A and the recess portion 220A. The slit 223A is recessed outward in the radial direction of the movable ring 22A.

The plate spring 30A has two plate-like portions and an arm portion elastically connecting the two plate-like portions. The arm portion is constituted of a thread-like winding elastic member.

The rear side coil substrate 40A is formed in an annular shape. Every two coils 121A are embedded on the +X side, the −X side, the +Y side and the −Y side of the through hole in the center of the rear side coil substrate 40A, respectively. The two coils 121A arranged on the +X side and the −X side are aligned in the Y direction and each of them has linear portions extending in the Y direction. The two coils 121A arranged on the +Y side and the −Y side are aligned in the X direction and each of them has linear portions extending in the X direction. Eight coils 121A are arranged at the same height. A rectangular notch 401A is provided at a position on the −X+Y side of the inner peripheral edge of the rear side coil substrate 40A, that is, a position between the coil 121A on the −X side and the coil 121A on the +Y side. Two lands (not shown) are provided on the +X side of the outer peripheral edge of the rear side coil substrate 40A. The two lands are electrically connected to each other via respective coils 121A arranged in the rear side coil substrate 40A.

The circuit board 41A is formed in an annular shape. A Hall IC 42A is fixed to a position corresponding to the notch 401A on the −X+Y side of the front surface of the circuit board 41A. The Hall IC 42A is a magnetic position sensor. Six lands (not shown) are provided at a position of the circuit board 41A where the Hall IC 42A is fixed. The six lands are electrically connected to six pads of the Hall IC 42A.

Two lands (not shown) are provided on the +X side of the outer peripheral edge of the circuit board 41A. Three lands (not shown) are provided on the +Y side and the −Y side of the rear surface of the circuit board 41A, respectively.

The base 43A is insert-molded with the main body of the base 43A made of resin, and two first metal members 94A, two second metal members 95A, and two third metal members 96A embedded in the resin.

The base 43A has an annular bottom surface. Column portions 431A rising on the +Z side are provided on the +X+Y side, the +X−Y side, the −X+Y side, and the −X−Y side of the inner peripheral edge surrounding the central through hole in the base 43A. Every three holes 434A are provided on the +Y side and the −Y side of the base 43A, respectively. The three holes 434A are aligned in the X direction.

Each first metal member 94A has an exposed portion 941A which is exposed in a hook-like shape in front and rear in the hole 434A on the +X side, an embedded portion 942A which protrudes from the exposed portion 941A to the +X side in an embedded state and extends to the nearest column portion 431A while bending, an a rising portion 943A which rises at the column portion 431A and extends forward along the column portion 431A. The front end portion of the rising portion 943A protrudes to the tip of the front edge of the column portion 431A and is exposed.

Each second metal member 95A has an exposed portion 951A which is exposed in a hook-like shape in front and rear in the middle hole 434A, an embedded portion 952A which extends from the exposed portion 951A toward the outer periphery side in an embedded state, and a blade side receiving portion 953A which rises in a stepped shape at the tip end of the embedded portion 952A and then projects outside the outer edge of the base 43A.

Each third metal member 96A has an exposed portion 961A which is exposed in a hook-like shape in front and rear in the hole 434A on the −X side, an embedded portion 962A which extends from the exposed portion 961A toward the outer periphery side in an embedded state, and a blade side receiving portion 963A which rises in a stepped shape at the tip end of the embedded portion 962A and then projects outside the outer edge of the base 43A.

The rising portions of the blade side receiving portions 953A and 963 are covered by a laterally long slender plate portion 439A in the X direction, and the blade side receiving portions 953A and 963 project outward from the side surface of the slender plate portion 439A.

The blade driving device 1A is manufactured as follows.

The circuit board 41A is fixed to the front surface of the base 43A. The exposed portions 941A, 951A, and 961A on the +Y side and the exposed portions 941A, 951A, and 961A on the −Y side of the base 43A are soldered to three lands on the +Y side and three lands on the −Y side of the circuit board 41A, respectively.

The rear side coil substrate 40A is fixed to the front surface of the circuit board 41A. The Hall IC 42A on the circuit board 41A is accommodated in the notch 401A on the −X+Y side of the rear side coil substrate 40A. Two lands on the +X side of the circuit board 41A are soldered to two lands on the +X side of the rear side coil substrate 40A, respectively. The rising portion 943A of the first metal member 94A of the base 43A extends forward through the edge of the through hole of the circuit board 41A.

The movable ring 22A is supported in the air via four plate springs 30A on the outer periphery side of four column portions 431A of the base 43A. The plate-like portion on the inner periphery side of the plate spring 30A is fixed to the side surface of the column portion 431A. The plate-like portion on the outer periphery side of the plate spring 30A is inserted into and fixed to the slit 223A of the movable ring 22A. The front end portion of the rising portion 943A of the first metal member 94A of the base 43A is soldered to the land 201A of the front side coil substrate 20A.

Figure 11:
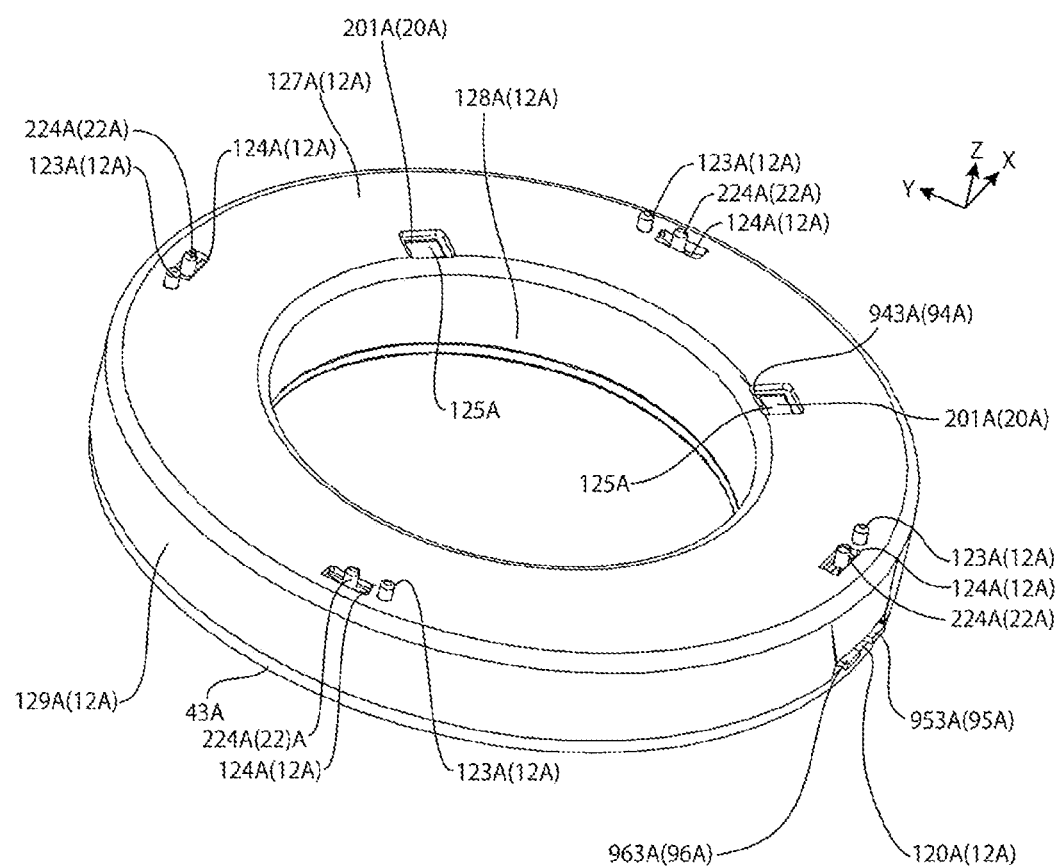
FIG. 11 is a diagram in which the blade is removed from FIG. 10.
Figure 12:
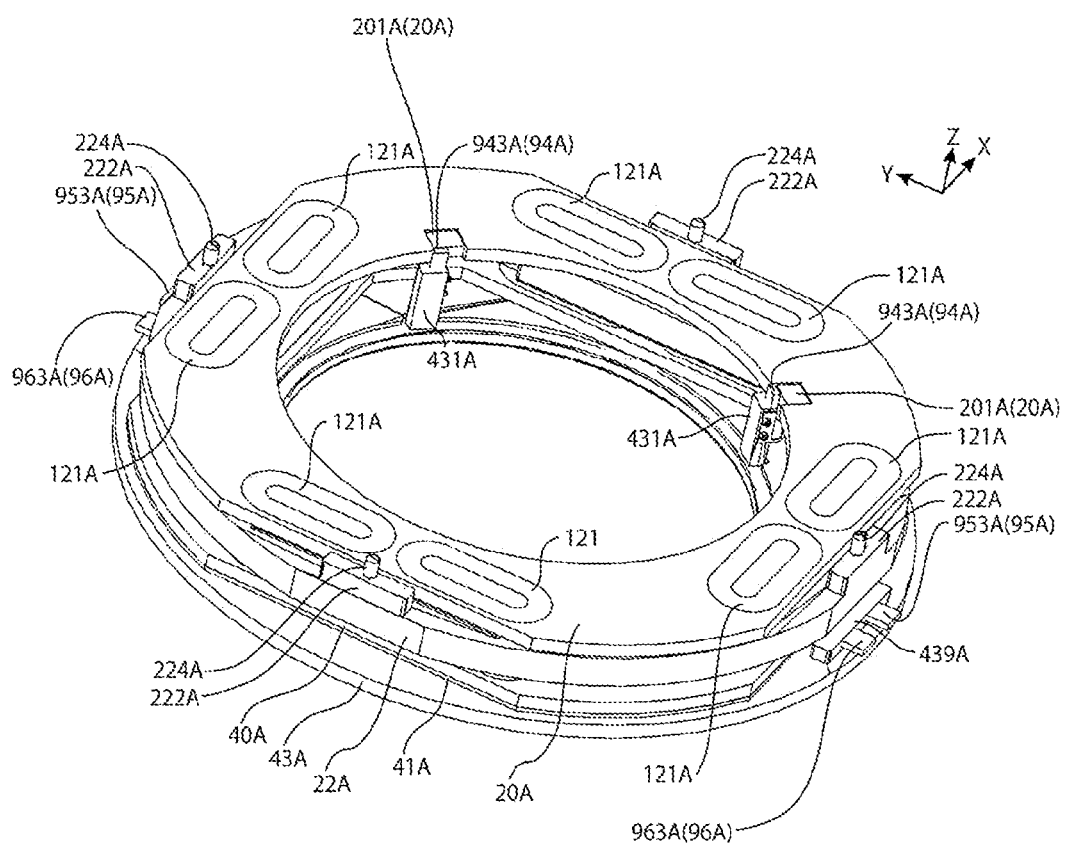
FIG. 12 is a diagram in which the fixed plate is removed from FIG. 11.
Figure 13:
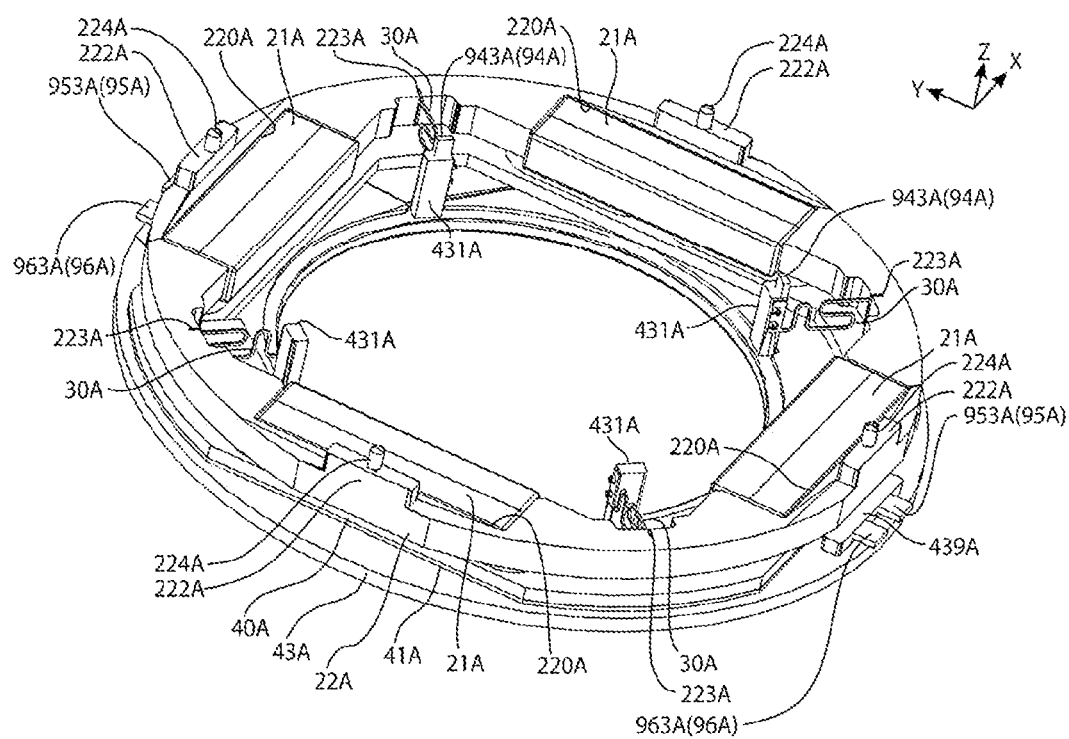
FIG. 13 is a diagram in which the front side coil substrate is removed from FIG. 12.
Figure 14:
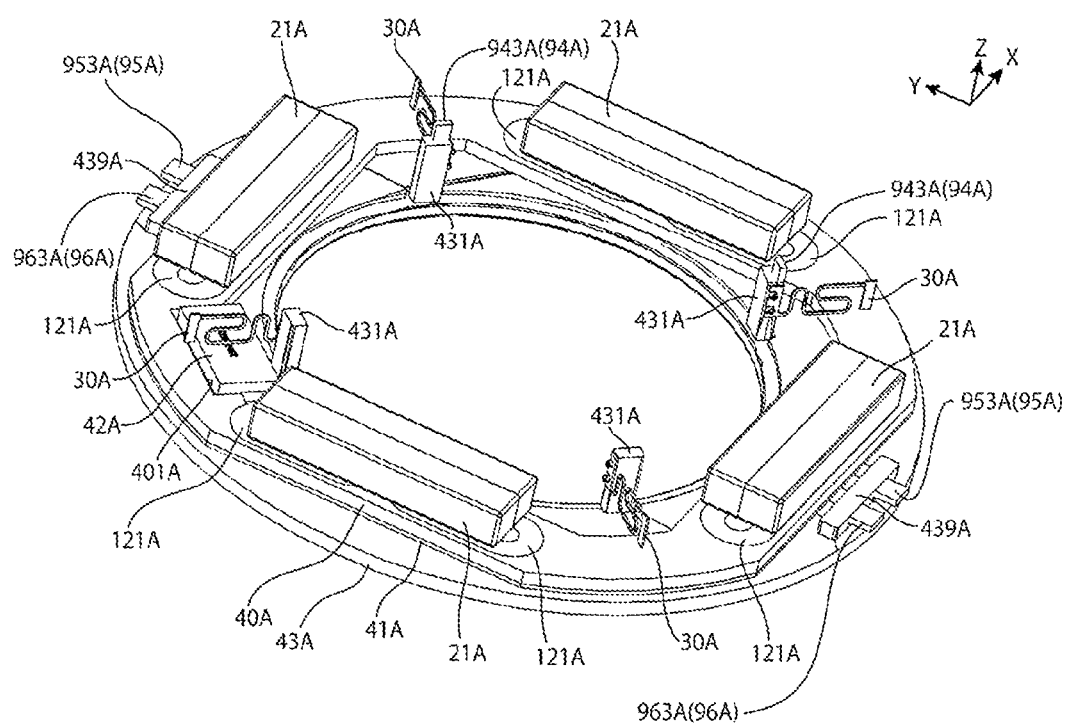
FIG. 14 is a diagram in which the movable ring is removed from FIG. 13.
Figure 15:
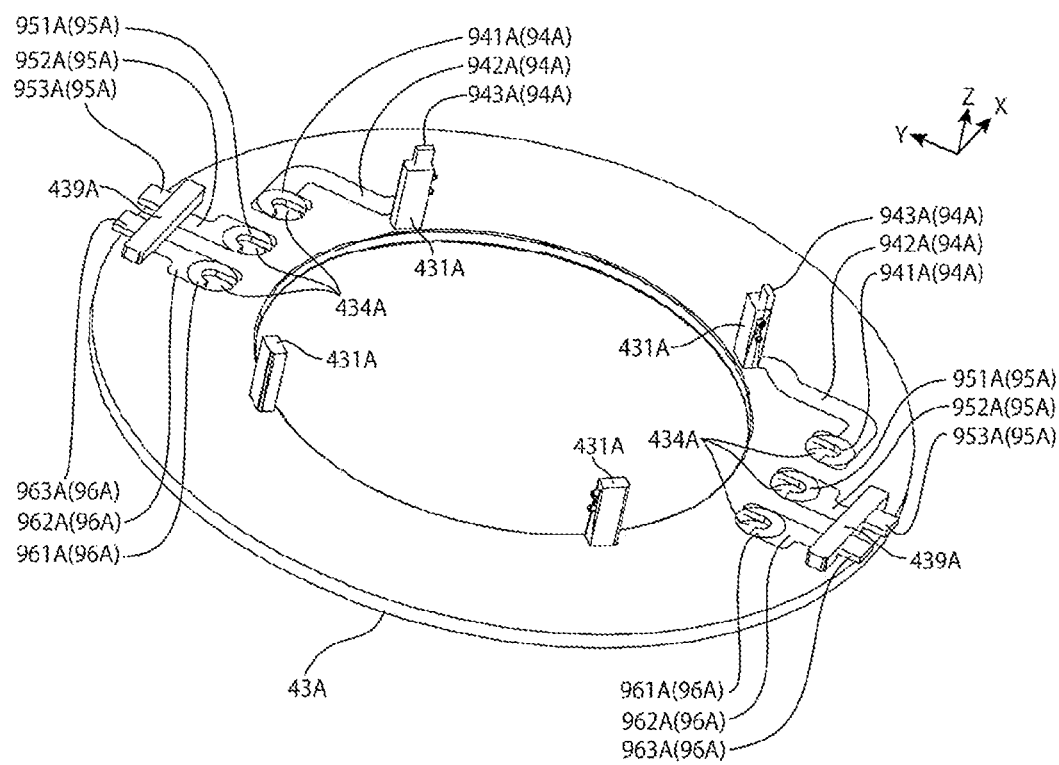
FIG. 15 is a diagram showing the base of FIG. 14.

The front side coil substrate 20A is previously fixed to the rear surface of the disk portion 127A of the fixed plate 12A. The lower edges of the inner peripheral wall portion 128A and outer peripheral wall portion 129A of the fixed plate 12A are fixed to the inner peripheral edge and the outer peripheral edge of the base 43A. In the front side coil substrate 20A, the lands 201A are soldered and electrically connected to the front end portions of the rising portions 943A of the first metal members 94A of the base 43A via the holes 125A. As shown in FIG. 11, the blade side receiving portions 953A and 963 of the base 43A are exposed to the outer periphery side via the notches 120A of the fixed plate 12A.

The front side coil substrate 20A, the movable ring 22A, the rear side coil substrate 40A, and the circuit board 41A are accommodated in an annular space between the inner peripheral wall portion 128A and the outer peripheral wall portion 129A of the fixed plate 12A. In this annular space, the coils 121A on the +X side, the −X side, the +Y side, and the −Y side of the front side coil substrate 20A and the rear side coil substrate 40A face each other with the magnets 21A on the X side, the −X side, the +Y side, and the −Y side sandwiched therebetween.

The Hall IC 42A is accommodated in the notch 401A on the −X+Y side of the rear side coil substrate 40A. The Hall IC 42A is located at a corner position between the group on the −X side and the group on the +Y side out of four groups composed of the magnets 21A and the coils 121A in the front and rear. The plate spring 30A on the −X+Y side is located on the front side of the Hall IC 42A. The six pads of the Hall IC 42A are electrically connected to the six lands on the front surface of the circuit board 41A.

Figure 10:
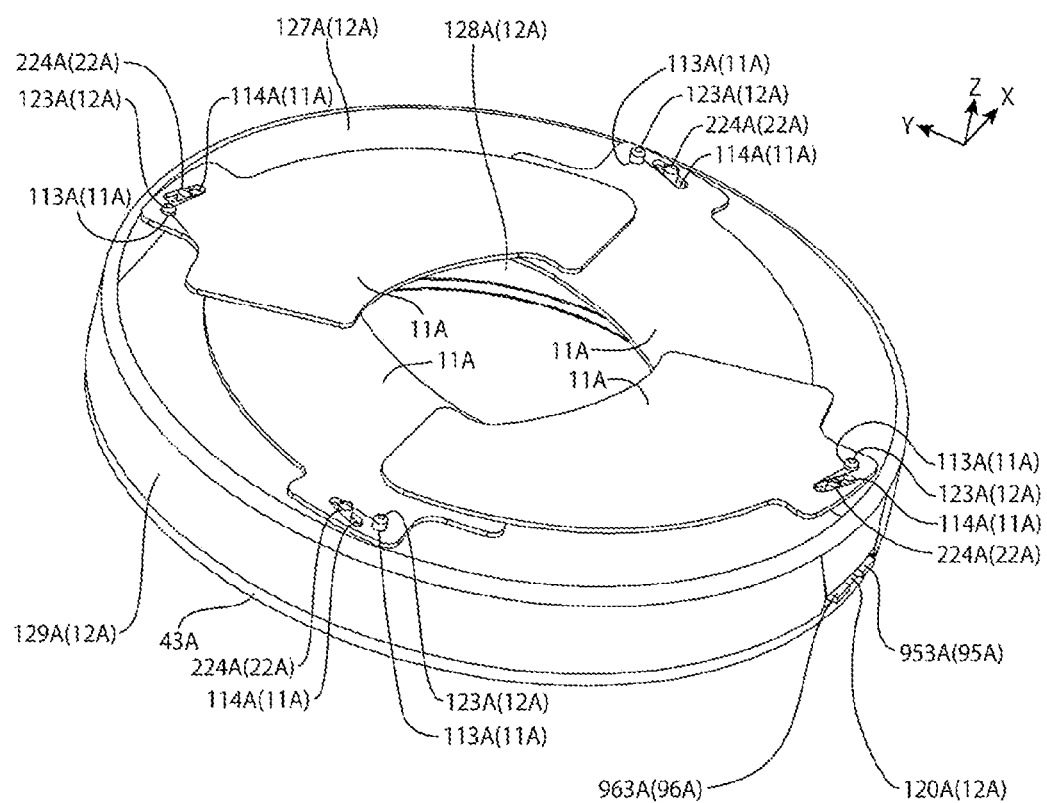
FIG. 10 is a diagram in which the cover is removed from FIG. 8.

As shown in FIG. 11, the movable pins 224A of the movable ring 22A are passed through the long holes 124A of the fixed plate 12A and project forward. As shown in FIG. 10, the fixing pins 123A of the fixed plate 12A are fitted into the fixing holes 113A of the blade 11A, and the movable pins 224A are fitted into the movable holes 114A of the blade 11A. The cover 10A is fixed to the outer peripheral edge of the disk portion 127A of the fixed plate 12A.

As shown in FIG. 7, the blade side receiving portions 953A and 963 protruding from the notches 120A on the +Y side and the −Y side of the blade driving device 1A are placed on the front end portions of two carrier side receiving portions 701A on the +Y side and the −Y side of the lens carrier 70A, respectively. The carrier side receiving portions 701A and the blade side receiving portions 953A and 963A are fixed and electrically connected by welding or solder joining.

The Hall IC 42A connected to the carrier side receiving portion 701A detects the magnetic field of the magnet 21A to detect the position of the magnet 21A in the rotation direction with respect to the Hall IC 42A, and outputs electric current for supplying to the coil 121A based on the result. When an electric current is supplied to the coils 121A of the front side coil substrate 20A and the rear side coil substrate 40A of the blade driving device 1A, a thrust force in a direction around the optical axis is produced by the electromagnetic force generated by the coils 121A and the magnets 21A. The movable ring 22A rotates with respect to the fixed plate 12A by this thrust force. With this rotation, the movable pin 224A of the movable ring 22A moves in the movable hole 114A of the blade 11A, and the blade 11A rotates around the axis of the fixing pin 123A fitted in the fixing hole 113A.

The details of the present second embodiment are explained above. The blade driving device 1A according to the present second embodiment includes: a fixed portion including a base 43A; a first metal member 94A having an embedded portion 942A embedded in the base 43A, a rising portion 943A rising from the embedded portion 942A; a blade 11A; a movable ring 22A supported so as to be rotatable with respect to the fixed portion and moving the blade 11A by rotation; a front side coil substrate 20A and a rear side coil substrate 40A fixed to the fixed portion and embedded with a plurality of coils 121A; and a magnet 21A sandwiched between the front side coil substrate 20A and the rear side coil substrate 40A and fixed to the movable ring 22A, wherein the front side coil substrate 20A is electrically connected to the rising portion 943A of the first metal member 94A. Thus, it is possible to provide a blade driving device 1A that can also supply power to the coil 121A located at a position away from the bottom surface.

It is to be noted that in the above second embodiment, the coil may be fixed to the movable ring 22A, and magnet may be fixed to the fixed plate 12A. In this case, since the coil to which the electric current is supplied moves together with the movable ring 22A, the plate spring arranged between the first metal member 94A of the base 43A and the movable ring 22A may be utilized as a member for electrical connection. The plate-like portion of the plate spring on the inner periphery side may be electrically connected to the first metal member 94A, and the plate-like portion of the plate spring on the outer periphery side may be electrically connected to the front side coil substrate 20A and the rear side coil substrate 40A. Further, at this time, an FPC attached to the movable ring 22A and electrically connected to the plate spring is provided, and the front side coil substrate 20A and the rear side coil substrate 40A are preferably electrically connected to this FPC.

Further, in the above second embodiment, the number of the groups of magnets 21A and coils 121A may be two groups, three groups or five groups or more.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A blade driving device in which a central axis is defined, comprising:
    a plurality of blades arranged around the central axis;
    two coil groups arranged around the central axis, comprising at least two coils with the central axis direction as a winding axis, and separated in the central axis direction; and
    a magnet arranged between the two coil groups in such a manner that a magnetized surface faces the two coil groups,
    wherein the coils and the magnet generate an electromagnetic force along a circumferential direction of a circle centered on the central axis to drive the blades, and
    the magnet extends in a direction orthogonal to a predetermined radius orthogonal to the central axis across the radius, and magnetic poles different from each other are aligned in a direction of the radius,
    each of the coil groups comprises two coils provided with the radius in between and facing respective magnetic poles,
    each of the two coils comprises two linear portions extending in a direction orthogonal to the predetermined radius direction, one of the two linear portions faces one of the magnetic poles, and the other of the linear portions faces the other of the magnetic poles.

2. The blade driving device according to claim 1, further comprising: a fixed portion; and a movable ring which is supported so as to be rotatable about the central axis with respect to the fixed portion and drives the blades by the rotation, wherein one of the two coil groups and the magnet is arranged at the fixed portion, and the other is arranged on the movable ring.

3. A camera device comprising the blade driving device according to claim 1.

4. An electronic apparatus comprising the camera device according to claim 3.

5. A blade driving device in which a central axis is defined, comprising:
    a plurality of blades arranged around the central axis;
    two coil groups arranged around the central axis, comprising at least two coils with the central axis direction as a winding axis, and separated in the central axis direction; and
    a magnet arranged between the two coil groups in such a manner that a magnetized surface faces the two coil groups, wherein the coils and the magnet generate an electromagnetic force along a circumferential direction of a circle centered on the central axis to drive the blades, and the blade driving device further comprises an FPC with a width in the central axis direction, the FPC extending in the circumferential direction, wherein the two coil groups are electrically connected to via the FPC.

6. The blade driving device according to claim 5, further comprising:
    a base;
    a movable ring supported so as to be rotatable about the central axis with respect to the base; and
    a plate spring connecting the base and the movable ring and supporting the movable ring,
    wherein the coil groups are fixed to a front side and a rear side of the movable ring, and the FPC is arranged on the outer side of the movable ring.

7. The blade driving device according to claim 6, wherein the plate spring is electrically connected to the base and the FPC, an the FPC is electrically connected to the coil groups at its front end side and rear end side.

8. The blade driving device according to claim 7, wherein the base comprises a through hole and is formed in an annular shape, and a column portion rises together with a metal member from a peripheral edge portion surrounding the through hole,
    the movable ring is provided with a hole,
    in the plate spring, an inner edge portion is electrically connected to the metal member, and an outer edge portion is electrically connected to the FPC via the hole.

9. The blade driving device according to claim 5, further comprising:
    a fixed portion; and
    a movable ring which is supported so as to be rotatable about the central axis with respect to the fixed portion and drives the blades by the rotation,
    wherein
    one of the two coil groups and the magnet is arranged at the fixed portion, and the other is arranged on the movable ring.

10. A camera device comprising the blade driving device according to claim 5.

11. An electronic apparatus comprising the camera device according to claim 10.

12. A blade driving device in which a central axis is defined, comprising:
    a plurality of blades arranged around the central axis;
    two coil groups arranged around the central axis, comprising at least two coils with the central axis direction as a winding axis, and separated in the central axis direction; and
    a magnet arranged between the two coil groups in such a manner that a magnetized surface faces the two coil groups,
    wherein the coils and the magnet generate an electromagnetic force along a circumferential direction of a circle centered on the central axis to drive the blades, and
    the blade driving device further comprising:
        a fixed portion comprising a base;
        a metal member comprising an embedded portion embedded in a bottom surface of the base, and a rising portion rising forward from the embedded portion; and
        a movable ring which is supported so as to be rotatable with respect to the fixed portion and moves the blades by rotation, and
        wherein two coil groups separated in the central axis direction are a front side coil substrate and a rear side coil substrate fixed to one of the fixed portion and the movable ring and embedded with a plurality of coils, respectively,
        the magnet is sandwiched between the front side coil substrate and the rear side coil substrate and fixed to the other of the fixed portion and the movable ring, and
        the front side coil substrate is electrically connected to the rising portion of the metal member.

13. The blade driving device according to claim 12, further comprising a circuit board arranged on the base,
    wherein the front side coil substrate is electrically connected to the circuit board via the metal member, and the rear side coil substrate is directly electrically connected to the circuit board.

14. The blade driving device according to claim 12, wherein
    a front end portion of the rising portion of the metal member is soldered to the front side coil substrate.

15. The blade driving device according to claim 12, further comprising:
    a plate spring which connects the metal member and the movable ring,
        wherein one end portion of the plate spring is electrically connected to the metal member, and the other end portion of the plate spring is electrically connected to the front side coil substrate and the rear side coil substrate fixed to the movable ring.

16. The blade driving device according to claim 15, further comprising:
    an FPC attached to the movable ring and electrically connected to the plate spring,
        wherein the front side coil substrate and the rear side coil substrate are electrically connected to the FPC.

17. The blade driving device according to claim 12, wherein
    the rising portion of the metal member rises from an inner peripheral end of the base.

18. A camera device comprising the blade driving device according to claim 12.

19. An electronic apparatus comprising the camera device according to claim 18.

* * * * *